(12) United States Patent
Lee et al.

(10) Patent No.: US 10,170,626 B2
(45) Date of Patent: Jan. 1, 2019

(54) TRANSISTOR PANEL HAVING A GOOD INSULATION PROPERTY AND A MANUFACTURING METHOD THEREOF

(71) Applicant: SAMSUNG DISPLAY CO., LTD., Yongin-si, Gyeonggi-Do (KR)

(72) Inventors: Kwang Soo Lee, Gwangmyeong-si (KR); Shin Hyuk Yang, Seongman-si (KR); Doo Hyun Kim, Goyang-si (KR); Jee Hoon Kim, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 44 days.

(21) Appl. No.: 15/412,278

(22) Filed: Jan. 23, 2017

(65) Prior Publication Data

US 2017/0317216 A1    Nov. 2, 2017

(30) Foreign Application Priority Data

Apr. 29, 2016  (KR) .......................... 10-2016-0053469

(51) Int. Cl.
*H01L 29/10* (2006.01)
*H01L 29/12* (2006.01)
(Continued)

(52) U.S. Cl.
CPC ...... *H01L 29/78606* (2013.01); *H01L 27/127* (2013.01); *H01L 27/1225* (2013.01);
(Continued)

(58) Field of Classification Search
CPC .......... H01L 29/78606; H01L 29/7869; H01L 29/78696; H01L 2227/323; H01L 27/1225;
(Continued)

(56) References Cited

U.S. PATENT DOCUMENTS

2012/0001167 A1* 1/2012 Morosawa .......... H01L 29/7869
257/43
2015/0037932 A1 2/2015 Yamazaki et al.
(Continued)

FOREIGN PATENT DOCUMENTS

EP    2916310    9/2015
KR    10-2015-0018501    2/2015
(Continued)

*Primary Examiner* — Meiya Li
(74) *Attorney, Agent, or Firm* — F. Chau & Associates, LLC

(57) ABSTRACT

A transistor panel includes a channel region including an oxide of a first metal, a source region and a drain region, each including the first metal, wherein the channel region is disposed between the source and drain regions, and wherein the channel region is connected to the source and drain regions, an insulation layer disposed on the channel region, an upper electrode disposed on the insulation layer, an interlayer insulation layer disposed on the upper electrode, the source region and the drain region, and a barrier layer including a first portion disposed between the interlayer insulation layer and each of the source and drain regions, wherein the first portion of the barrier layer contacts each of the source and drain regions. The upper electrode and the barrier layer each comprise a second metal.

7 Claims, 29 Drawing Sheets

(51) Int. Cl.
    *H01L 29/786*     (2006.01)
    *H01L 27/12*      (2006.01)
    *H01L 29/66*      (2006.01)
    *H01L 27/32*      (2006.01)

(52) U.S. Cl.
    CPC .... *H01L 29/66969* (2013.01); *H01L 29/7869* (2013.01); *H01L 29/78696* (2013.01); *H01L 27/3262* (2013.01); *H01L 2227/323* (2013.01)

(58) Field of Classification Search
    CPC ............... H01L 27/127; H01L 27/3262; H01L 29/66969; H01L 29/78618; G02F 1/1368
    See application file for complete search history.

(56) References Cited

U.S. PATENT DOCUMENTS

| | | |
|---|---|---|
| 2015/0243689 A1 | 8/2015 | Lee et al. |
| 2015/0279916 A1 | 10/2015 | Takamaru |

FOREIGN PATENT DOCUMENTS

| | | |
|---|---|---|
| KR | 10-2015-0067307 | 6/2015 |
| KR | 10-2015-0093616 | 8/2015 |
| WO | 2013/167374 | 11/2013 |

* cited by examiner

US 10,170,626 B2

TRANSISTOR PANEL HAVING A GOOD INSULATION PROPERTY AND A MANUFACTURING METHOD THEREOF

CROSS-REFERENCE TO RELATED APPLICATION

This application claims priority under 35 U.S.C. § 119 to Korean Patent Application No. 10-2016-0053469, filed in the Korean Intellectual Property Office on Apr. 29, 2016, the disclosure of which is incorporated by reference herein in its entirety.

TECHNICAL FIELD

Exemplary embodiment of the present invention relate to a transistor panel, and more particularly, to a transistor panel having a good insulation property and a manufacturing method thereof.

DISCUSSION OF THE RELATED ART

Transistors are widely used in electronic devices such as display devices. A transistor may include a gate electrode and a semiconductor layer overlapping the gate electrode. The semiconductor layer may include a source region and a drain region with a channel region disposed therebetween.

The semiconductor layer may include various elements that have good carrier mobility (e.g., electron mobility). However, the carrier mobility of the semiconductor layer may be changed when an impurity flows into the semiconductor layer. A change in the carrier mobility of the semiconductor layer may result in a reduction of reliability of the transistor panel.

SUMMARY

The present invention relates to a transistor panel including a transistor having increased carrier mobility and increased reliability by preventing impurities, including hydrogen and moisture, from permeating into a semiconductor layer of the transistor, and to a method of manufacturing the transistor panel without increasing a number of photomasks or without adding a deposition process.

In addition, the present invention relates to a method of manufacturing a transistor panel by forming a part of a metal oxide semiconductor as a conductive region without increasing the number of photo masks or without performing an additional doping process, and to a transistor panel having an increased carrier mobility in the conductive region.

According to an exemplary embodiment of the present invention, a transistor panel includes a channel region including an oxide of a first metal, a source region and a drain region, each including the first metal, wherein the channel region is disposed between the source and drain regions, and wherein the channel region is connected to the source and drain regions, an insulation layer disposed on the channel region, an upper electrode disposed on the insulation layer, an interlayer insulation layer disposed on the upper electrode, the source region and the drain region, and a barrier layer including a first portion disposed between the interlayer insulation layer and each of the source and drain regions, wherein the first portion of the barrier layer contacts each of the source and drain regions. The upper electrode and the barrier layer each comprise a second metal.

According to an exemplary embodiment of the present invention, a transistor panel includes a channel region including an oxide including a first metal, a source region and a drain region, each including the first metal, wherein the channel region is disposed between the source and drain regions and is connected to the source and drain regions, an insulation layer disposed on the channel region, an upper electrode disposed on the insulation layer, an interlayer insulation layer disposed on the upper electrode, the source region, and the drain region, and a barrier layer including a first portion and a second portion. The first portion of the barrier layer is disposed between the interlayer insulation layer and each of source and drain regions. The first portion of the barrier layer contacts the source region and the drain region. The second portion of the barrier layer is disposed between the upper electrode and the insulation layer.

According to an exemplary embodiment of the present invention, a method for manufacturing a transistor panel includes forming a semiconductor pattern on a substrate, the semiconductor pattern including an oxide of a first metal, forming an insulation layer on the semiconductor pattern, forming a metal layer on the semiconductor pattern and the insulation layer by disposing a second metal material on the semiconductor pattern and the insulation layer, forming a source region and a drain region by reducing the semiconductor pattern, and forming a barrier layer by oxidizing a lower portion of the metal layer, the lower portion of the metal layer contacting the semiconductor pattern, wherein a first portion of the barrier layer contacts each of the source and drain regions, forming an upper electrode on the insulation layer by etching the metal layer, and forming an interlayer insulation layer on the upper electrode and the barrier layer.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
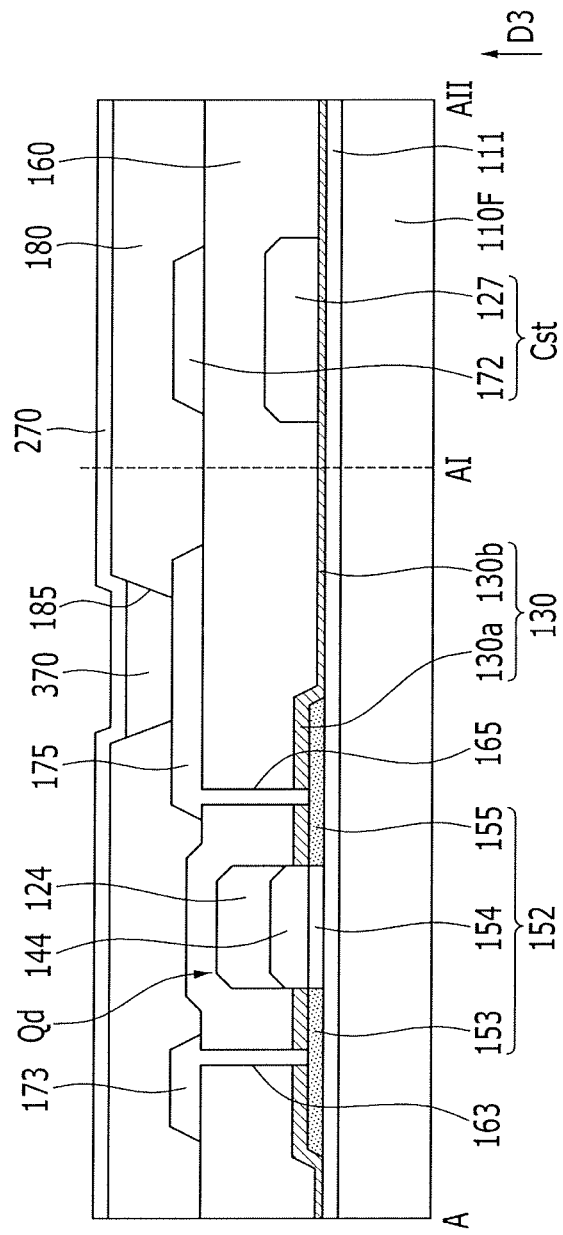
FIG. 1 is a cross-sectional view of a transistor panel according to an exemplary embodiment of the present invention.

The present invention will be described more fully hereinafter with reference to the accompanying drawings. The described embodiments may be modified in various different ways without departing from the spirit and scope of the present invention.

Like reference numerals may refer to like elements throughout the specification.

In the drawings, the sizes and thicknesses of the layers, films, panels, regions, etc., may be exaggerated for clarity.

It will be understood that when an element, a layer, a film, a region, or a substrate is referred to as being disposed "on" another element, layer, film, region or substrate, the element, layer, film, region or substrate may be directly disposed on the other element, layer, film, region or substrate, or intervening elements, layers, films, regions or substrates may be interposed therebetween.

FIG. 1 is a cross-sectional view of a transistor panel according to an exemplary embodiment of the present invention.

Referring to FIG. 1, a transistor panel may be a display panel that may be used in various types of display devices. The transistor panel includes a substrate 110F and a plurality of transistors Qd disposed at a side of the substrate 110F. For convenience of description, FIG. 1 illustrates one transistor Qd. However, it is understood that there can be any number of transistors in an exemplary embodiment of the present invention.

The substrate 110F may include an insulating material such as plastic, glass, or the like, and may be flexible. A part of the substrate 110F may be removed when needed. The direction D3, shown in FIG. 1, may also be referred to as a cross-section direction that is perpendicular to the side surface of the substrate 110F on which the transistors Qd are disposed. A first direction D1 (shown in FIG. 2) and a second direction D2 (shown in FIG. 2) may cross each other, for example, perpendicularly. The third direction D3 may cross each of the first and second directions D1 and D2, for example, perpendicularly. A view of a plane formed by the first and second directions D1 and D2 may be referred to as a plan view or a layout view of the transistor panel.

The transistor Qd may include a semiconductor layer 152, an upper electrode 124, and an insulation layer 144 disposed between the semiconductor layer 152 and the upper electrode 124.

The semiconductor layer 152 includes a channel region 154 where a channel of the transistor Qd is formed, a source region 153, and a drain region 155. The source region 153 and the drain region 155 may each be disposed at opposite sides of the channel region 154 and face each other. The source region 153 and the drain region 155 may be disposed on the same layer as the channel region 154, and may be connected to the channel region 154.

The channel region 154 may include a metal oxide. The metal oxide of the channel region 154 may include an oxide including indium, for example, indium oxide (InO), indium-zinc oxide (IZO), indium-gallium oxide (IGO), indium-gallium-zinc oxide (IGZO), indium-gallium-tin oxide (IGTO), indium-zinc-tin oxide (IZTO), zinc oxide (ZnO), zinc-tin oxide (ZTO), or the like.

The source region 153 and the drain region 155 may include a same metal as the channel region 154. In addition, the source region 153 and the drain region 155 may include a same metal oxide as the channel region 154. Oxygen density in the channel region 154 may be higher than that of the source region 153 and the drain region 155.

A carrier concentration level of the source region 153 and the drain region 155 may be greater than a carrier concentration level of the channel region 154. The source region 153 and the drain region 155 may each conduct electricity. A gradient area where the carrier concentration is gradually changed may be further disposed between each of the source and drain regions 153 and 155 and the channel region 154. The source region 153 and the drain region 155 can be formed by extracting the oxygen contained in the source and drain regions 153 and 155, and then reducing the metal oxide included in the source and drain regions 153 and 155.

The upper electrode 124 overlaps the channel region 154, and the insulation layer 144 is interposed between the upper electrode 124 and the channel region 154. The upper electrode 124 may include a conductive material such as a metal. The upper electrode 124 may serve as a gate electrode of the transistor Qd.

The insulation layer 144 may be disposed entirely between the semiconductor layer 152 and the upper electrode 124. An edge of the insulation layer 144 may be substantially parallel with an edge of the upper electrode 124. When two edges are substantially parallel with each other, the two edges may be extend along a same plane as each other, or may extend on different planes from each other. In addition, two parallel edges may be slanted with respect to, for example, the substrate 110F. For example, in the plan view of the transistor panel (see FIG. 2), the shape of the insulation layer 144 and the shape of the upper electrode 124 may be substantially the same. For example, the insulation layer 144 and the upper electrode 124 may overlap each other and have the same shape in plan view.

The insulation layer 144 may include an inorganic insulation material such as a silicon oxide (SiOx), a silicon nitride (SiNx), or a silicon nitroxide (SiON), or an organic insulation material. The insulation layer 144 may include an oxide-based insulation material such as a silicon oxide (SiOx) which contains a sufficiently small amount of hydrogen (H) to prevent hydrogen (H) from flowing into the channel region 154.

Edges of the channel region 154 may be substantially parallel to and aligned with respective edges of the upper electrode 124. For example, an interface between the channel region 154 and the source region 153 and an interface between the channel region 154 and the drain region 155 may be substantially parallel to and aligned with respective edges of the upper electrode 124. Accordingly, in plan view, the shape of the channel region 154 may be substantially the same as that of the upper electrode 124.

A buffer layer 111 may be disposed between the substrate 110F and the transistor Qd. The buffer layer may 111 prevent permeation of an impurity into the semiconductor layer 152 from the substrate 110F to protect the semiconductor layer 152 and to prevent characteristics of the channel region 154 from being changed due to exposure to ambient air or impurities.

The buffer layer 111 may include an inorganic insulation material such as a silicon oxide (SiOx), a silicon nitride (SiNx), or the like, or an organic insulation material. The buffer layer 111 may include an oxide-based insulation material such as a silicon oxide (SiOx) that contains a sufficiently small amount of hydrogen (H) such that flow of the hydrogen (H) into the channel region 154 can be prevented.

As shown in FIG. 1, the buffer layer 111 may be disposed above the entire surface of the substrate 110F, or it may be disposed above only a part of the substrate 110F. For example, the buffer layer 111 may be patterned to be disposed entirely between the semiconductor layer 152 and the substrate 110F. However, in an exemplary embodiment of the present invention, the buffer layer 111 may be omitted.

An interlayer insulation layer 160 may be disposed on the transistor Qd. The interlayer insulation layer 160 may be a single layer or as a multilayer structure. The interlayer insulation layer 160 may include an inorganic insulation material such as a silicon oxide (SiOx), a silicon nitride (SiNx), or the like, or an organic insulation material.

A barrier layer 130 may be disposed between the source region 153 and the interlayer insulation layer 160, between the drain region 155 and the interlayer insulation layer 160, and/or between the buffer layer 111 and the interlayer insulation layer 160. The barrier layer 130 may include a first portion 130a, and a second portion 130b. The first portion 130a may be disposed between each of the source region 153 and the interlayer insulation layer 160, and the drain region 155 and the interlayer insulation layer 160. In addition, the first portion 130a may be disposed adjacent to the source region 153 and the drain region 155. The second portion 130b might not overlap the semiconductor layer 152, and may be adjacent to the buffer layer 111. Here, when two elements are described as being disposed adjacent to each other, the two elements may be directly adjacent to each other, and thus may contact each other without an interposing element disposed therebetween.

The first portion 130a of the barrier layer 130 is disposed between the source region 153 and the interlayer insulation layer 160 and between the drain region 155 and the interlayer insulation layer 160. The first portion 130a overlaps the source region 153 and the drain region 155 in the third direction D3, and may cover upper surfaces and side surfaces of the source region 153 and the drain region 155. The first portion 130a of the barrier layer 130 may prevent permeation of an impurity such as hydrogen, moisture, or the like, into the semiconductor layer 152, including the source region 153 and the drain region 155, from layers disposed above the semiconductor layer 152 such that the amount of an impurity such as hydrogen, moisture, or the like, which may affect features of the channel region 154, such as carrier mobility in the channel region 154, can be prevented from being changed. Thus, characteristics of the semiconductor layer 152 and the transistor Qd, including the semiconductor 152, can be stabilized and reliability can be increased. Since the barrier layer 130 contains oxygen, interlayer mobility of oxygen is lower than that of hydrogen such that an influence of oxygen on the characteristics of the channel region 154 of the semiconductor layer 153 is low compared to the influence of hydrogen on the characteristics of the channel region 154.

As described, since permeation of the impurity such as hydrogen into the channel region 154 from the interlayer insulation layer 160 can be blocked by the barrier layer 130, a material of the interlayer insulation layer 160 can be selected as desired. For example, the interlayer insulation layer 160 may include a nitride-based insulation material having a low reactivity with the upper electrode 124, such as a silicon nitride (SiNx). The nitride-based insulation material may contain more hydrogen than the oxide-based insulation material, but permeation of hydrogen into the semiconductor layer 152 can be prevented by the barrier layer 130.

The barrier layer 130 may include a metal oxide. The barrier layer 130 may include a metal that is different from the metal included in the semiconductor layer 152. For example, the barrier layer 130 may include highly reactive aluminum (Al), titanium (Ti), molybdenum (Mo), or the like. In addition, the barrier layer 130 and the upper electrode 124 may include the same metal. The barrier layer 130 may be electrically insulating.

The first portion 130a and the second portion 130b may be connected to each other and/or may be portions of a same layer. The thickness of the first portion 130a of the barrier layer 130 in the third direction D3 may be greater than the thickness of the second portion 130b in the third direction D3.

In an exemplary embodiment of the present invention, the second portion 130b of the barrier layer 130 may be omitted. When the buffer layer 111, including an oxide-based insulation material, is omitted, the second portion 130b of the barrier layer 130 can be omitted.

A first conductor 127 may be disposed between the second portion 130b of the barrier layer 130 and the interlayer insulation layer 160. The first conductor 127 is disposed in the same layer as the upper electrode 124 as shown in FIG. 1, and may include a same material as the upper electrode 124. In addition, the first conductor 127 may be connected with the upper electrode 124.

The interlayer insulation layer 160 and the barrier layer 130 may include a contact hole 163 disposed on the source region 153 of the semiconductor layer 152, and overlapping the source region 153. The interlayer insulation layer 160 and the barrier layer 130 may include a contact hole 165 disposed on the drain region 155 of the semiconductor layer 152, and overlapping the drain region 155. The interlayer insulation layer 160 and the barrier layer 130 are removed in the contact holes 163 and 165.

An upper conductive layer including a source electrode 173, a drain electrode 175, and a second conductor 172 may be disposed on the interlayer insulation layer 160.

The source electrode 173 is electrically connected to the source region 153 and contacts the source region 153 through the contact hole 163. The drain electrode 175 is electrically connected with the drain region 155 and contacts the drain region 155 through the contact hole 165.

The second conductor 172 may form a storage capacitor Cst by overlapping the first conductor 127, with the interlayer insulation layer 160 being interposed therebetween. The storage capacitor Cst may maintain a voltage applied to the upper electrode 124 of the transistor Qd constant for a predetermined time period.

The upper conductive layer may include a conductive material including a metal. For example, the upper conductor may have a structure in which molybdenum (Mo), and/or aluminum (Al). In addition, the upper conductor layer may include an aluminum alloy such as an aluminum-nickel-lanthanum alloy (ANL) and indium tin oxide sequentially layered at the bottom thereof (e.g., the side of the upper conductive layer that faces the barrier layer 130).

A passivation layer 180 may be disposed above the interlayer insulation layer 160 and the upper conductive layer. The passivation layer 180 may include an inorganic insulating material and/or an organic insulating material, and may be formed to have a single layer or a multilayer structure. An upper surface of the passivation layer 180 may be substantially flat.

The passivation layer 180 may include a hole 185 disposed above the drain electrode 175 and overlapping the drain electrode 175.

An emission layer 370, disposed above the drain electrode 175, may be disposed in the hole 185 of the passivation layer 180. A common electrode 270 may be disposed above the emission layer 370. The common electrode 270 may receive a common voltage. The drain electrode 175, the emission layer 370, and the common electrode 270 form an organic light emitting diode (OLED). The drain electrode 175 may form an anode of the OLED and the common electrode 270 may form a cathode of the OLED, or vice-versa. The light emitted from the emission layer 370 may be directed downward, passing through the substrate 110F, to be viewed by a user, or the light emitted from the emission layer 370 may be directed upward, to be viewed by the user without passing through the substrate 110F.

The structure of layers disposed above the drain electrode 175 is not limited to that illustrated in the drawings, and may be variously modified depending on the type of transistor panel and display device including the transistor panel.

Figure 2:
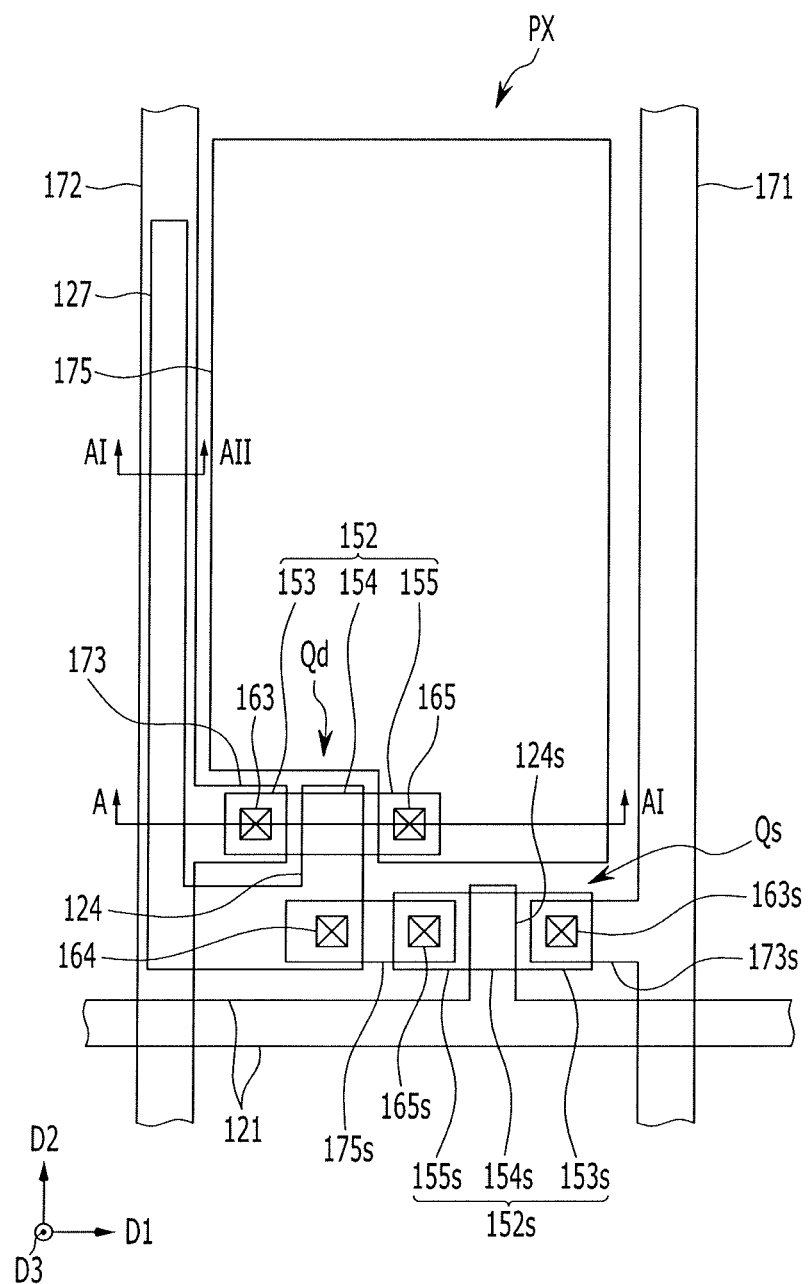
FIG. 2 is a layout view of a transistor panel according to an exemplary embodiment of the present invention.
Figure 3:
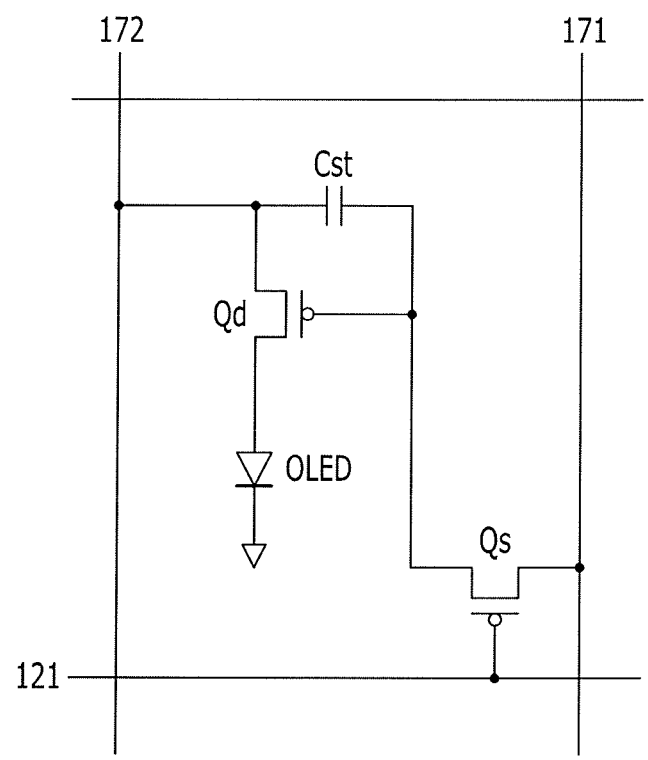
FIG. 3 is a circuit diagram of a pixel included in a transistor panel, according to an exemplary embodiment of the present invention.

FIG. 2 is a layout view of a transistor panel according to the exemplary embodiment of the present invention. FIG. 1 is, for example, a cross-sectional view of the transistor panel of FIG. 2 taken along lines A-AI and AI-AII. FIG. 3 is a circuit diagram of a pixel PX included in a transistor panel, according to an exemplary embodiment of the present invention.

Referring to FIG. 1 and FIG. 2, a gate line 121 transmitting a gate signal, a data line 171 transmitting a data signal, a switching transistor Qs including a switching semiconductor layer 152s and a switching gate electrode 124s, a switching source electrode 173s, and a switching drain electrode 175s may be disposed above the substrate 110F.

The gate line 121 may extend in the first direction D1, and the data line 171 may extend in the second direction D2. The second conductor 172 transmits a driving voltage, may extend in the second direction D2 and may be parallel with the data line 171.

The switching semiconductor layer 152s includes a channel region 154s where a channel of the switching transistor Qs is formed, a switching source region 153s, and a switching drain region 155s. The switching source region 153s and the switching drain region 155s are respectively disposed at opposite ends of the channel region 154s. The switching semiconductor layer 152s may include a metal oxide and may be disposed in the same layer as the semiconductor layer 152 of the transistor Qd. However, exemplary embodiment of the present invention are not limited thereto.

The carrier concentration level of the switching source region 153s and the switching drain region 155s may be greater than the carrier concentration level of the switching channel region 154s. The switching source region 153s and the switching drain region 155s may conduct electricity.

The switching gate electrode 124s overlaps the channel region 154s of the switching semiconductor layer 152s. A gate insulation layer (not shown) may be interposed between the switching gate electrode 124s the channel region 154s. The switching gate electrode 124s may be disposed in the same layer as the upper electrode 124 of the transistor Qd. The switching gate electrode 124s may be connected with the gate line 121 to receive a gate signal. The gate line 121 may be disposed in the same layer as the switching gate electrode 124s.

When the switching semiconductor layer 152s is disposed in the same layer as the semiconductor layer 152, the previously described barrier layer 130 may further include a portion disposed between the switching source region 153s, the switching drain region 155s, and the interlayer insulation layer 160.

The interlayer insulation layer 160 and the barrier layer 130 may further include a contact hole 163s disposed on the switching source region 153s of the switching semiconductor layer 152s, and overlapping the switching source region 153s, and a contact hole 165s disposed on the switching drain region 155s, and overlapping the switching drain region 155s.

The switching source electrode 173s and the switching drain electrode 175s may be disposed above the interlayer insulation layer 160. The switching source electrode 173s may be electrically connected with the switching source region 153s through the contact hole 163s, and may be electrically connected with the switching drain region 155s through the contact hole 165s.

The switching source electrode 173s may be connected with the data line 171 to receive a data signal and to transmit the received data signal to the switching transistor Qs. In this case, the data line 171 may be disposed on the same layer as the switching source electrode 173s. However, exemplary embodiment of the present invention are not limited thereto.

The interlayer insulation layer 160 may further include a contact hole 164 disposed on the upper electrode 124, which may be a gate electrode of the transistor Qd. The switching drain electrode 175s may be electrically connected with the upper electrode 124 through the contact hole 164. Thus, the upper electrode 124 can receive a voltage transmitted from the switching drain region 155s of the switching transistor Qs.

The upper electrode 124 may be connected with the first conductor 127, as shown in FIG. 2. The first conductor 127 may overlap the second conductor 172. The interlayer insulation layer 160 may be interposed between the first conductor 127 and the second conductor 172.

The source electrode 173 of the transistor Qd may be connected with the second conductor 172 to receive a driving voltage.

An equivalent circuit diagram of the pixel PX of FIG. 2 is illustrated in FIG. 3. Referring to FIG. 3, the pixel PX may include the switching transistor Qs, the transistor Qd, the storage capacitor Cst, and the OLED.

A control terminal of the switching transistor Qs may be connected with the gate line 121, an input of the switching transistor Qs may be connected with the data line 171, and an output terminal of the switching transistor Qs may be connected with a control terminal of the transistor Qd. The switching transistor Qs transmits the data signal, transmitted from the data line 171, to the control terminal of the transistor Qd in response to a gate signal transmitted by the gate line 121.

An input terminal of the transistor Qd may be connected with the second conductor 172, and an output terminal of the transistor Qd may be connected to the OLED. The transistor Qd outputs a current for which intensity may be changed depending on a voltage between the control terminal and the output terminal of the transistor Qd.

The storage capacitor Cst may be connected between the control terminal and the input terminal of the transistor Qd, and charges a data signal applied to the control terminal of the transistor Qd. The storage capacitor Cst may maintain the data signal after the switching transistor Qs is turned off.

The OLED emits light with intensity that varies depends on an output current of the transistor Qd such that an image may be displayed to a user.

As shown in the drawing, the switching transistor Qs and the transistor Qd may each be a PMOS or an NMOS transistor. The switching transistor Qs and the transistor Qd may have the same channel type or different channel types.

The structure shown in FIG. 2 and FIG. 3 are exemplary top plan views of the transistor panel and a pixel circuit of the transistor panel, to which the structure shown in FIG. 1 can be applied. According to an exemplary embodiment of the present invention, a display device may have a structure different from the structure shown in the FIGS. 1, 2 and/or 3.

FIG. 4 to FIG. 16 are cross-sectional views illustrating a manufacturing method of a transistor panel according to an exemplary embodiment of the present invention.

Figure 4:
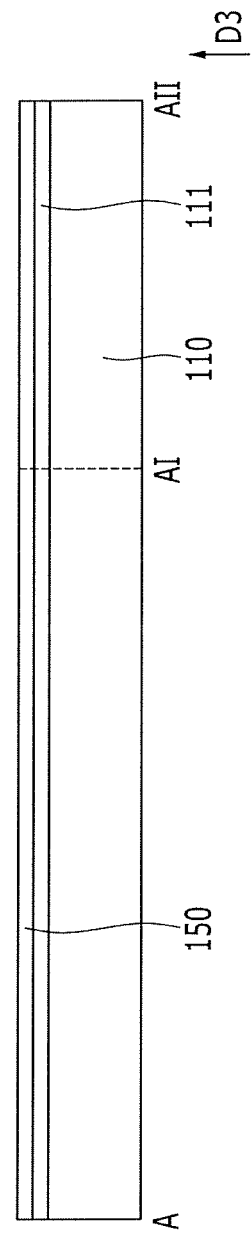
FIG. 4 to FIG. 16 are cross-sectional views illustrating a manufacturing method of a transistor panel according to an exemplary embodiment of the present invention.

Referring to FIG. 4, a buffer layer 111 may be formed by layering an insulating material on a substrate 110, the substrate 110 including an insulation material such as glass or plastic. A metal oxide semiconductor material such as an indium-containing oxide, for example, indium oxide (InO), indium-zinc oxide (IZO), indium-gallium oxide (IGO), indium-gallium-zinc oxide (IGZO), indium-gallium-tin oxide (IGTO), indium-zinc-tin oxide (IZTO), or the like, zinc oxide (ZnO), zinc-tin oxide (ZTO), or the like, are layered on the buffer layer 111 such that a semiconductor material layer 150 may be formed.

Figure 5:
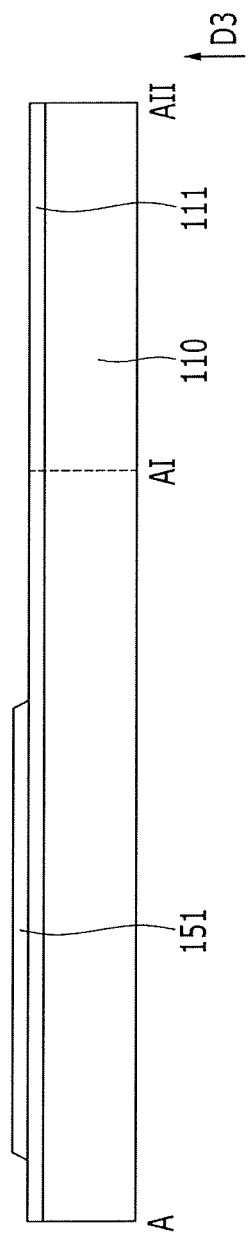

Referring to FIG. 5, the semiconductor material layer 150 may be patterned by using a method such as dry-etching, or the like, to form a semiconductor pattern 151.

Figure 6:
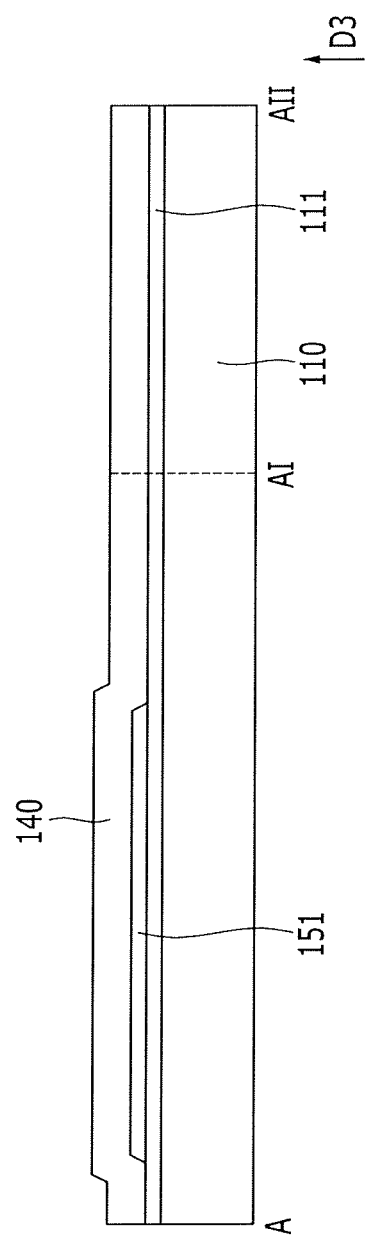

Referring to FIG. 6, an insulation material may be layered on the substrate 110 where the semiconductor pattern 151 may be formed, to form an initial insulation layer 140.

Figure 7:
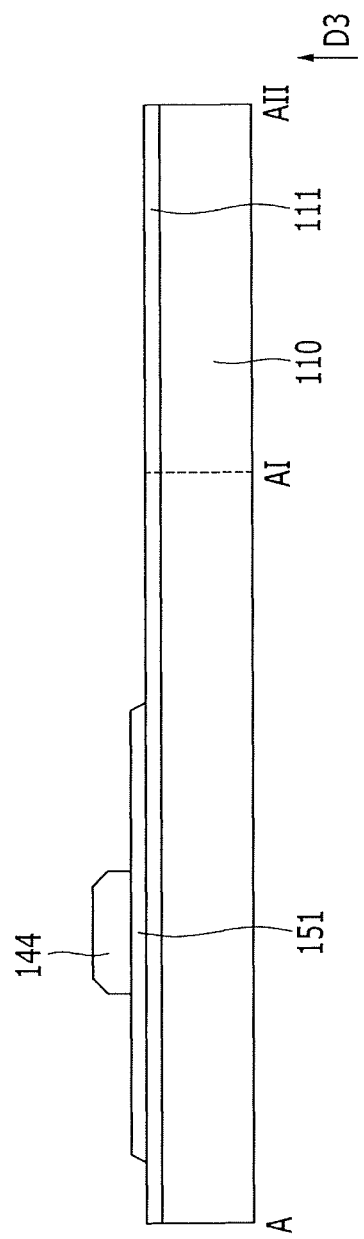

Referring to FIG. 7, the initial insulation layer 140 may be patterned by using a method such as dry-etching, or the like, to form an insulation layer 144.

Figure 8:
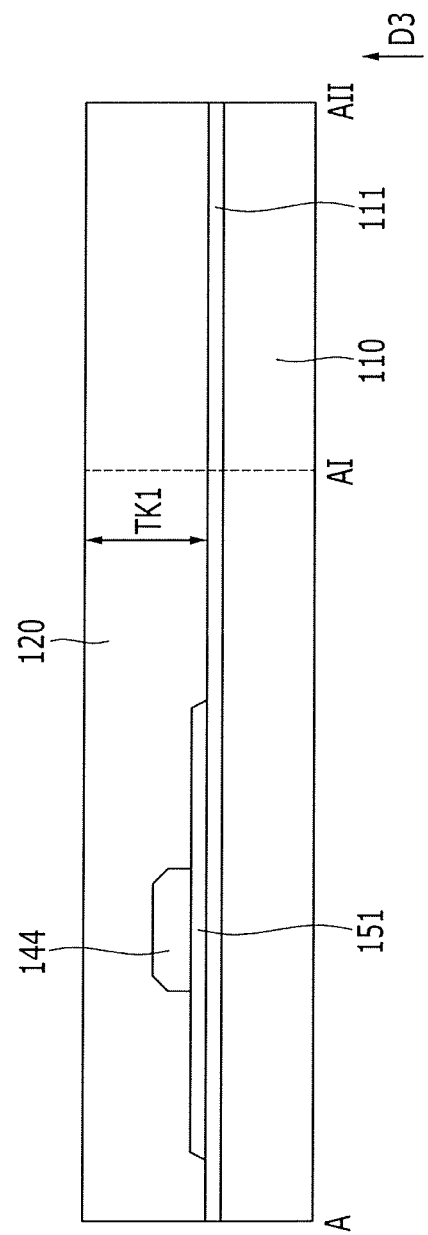

Referring to FIG. 8, a high-reactive metal such as aluminum (Al), titanium (Ti), molybdenum (Mo), or the like, may be layered on the substrate 110 where the insulation layer 144 is formed, to form a metal layer 120. A thickness TK1 of the third direction D3 of the metal layer 120 may be about 3000 angstroms to about 5000 angstroms, but it is not limited thereto.

Figure 9:
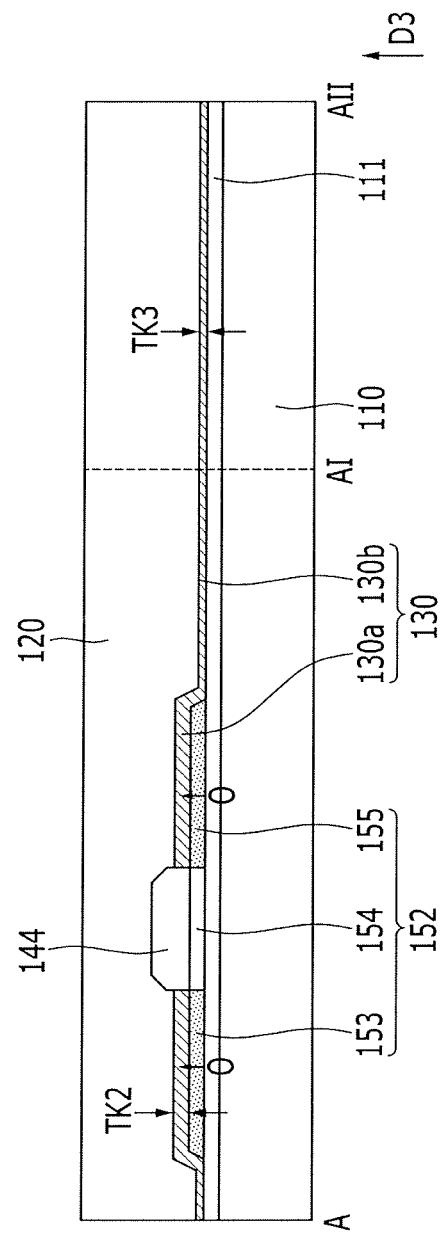

Referring to FIG. 9, the substrate 110, where the metal layer 120 is formed, may be thermally treated. In this case, the heat treatment may be a vacuum-state heat treatment. During the thermal treatment, oxygen (O) moves from a first portion of the semiconductor pattern 151 to a first lower portion of the adjacent metal layer 120 that overlaps the first portion of the semiconductor pattern 151 such that the first portion of the semiconductor pattern 151 may be reduced adjacent to the metal layer 120. The first portion of the semiconductor pattern 151 which the oxygen (O) moves from excludes a second portion of the semiconductor pattern 151, the second portion of the semiconductor pattern 151 overlapping the insulation layer 144. The reduced portion of the semiconductor pattern 151 (e.g., the first portion of the semiconductor pattern 151), excluding the second portion of the semiconductor pattern 151, becomes a source region 153 and a drain region 155. The source and drain regions 153 and 155 are electrically conductive. The second portion of the semiconductor pattern 151 (e.g., the portion of the semiconductor pattern 151 covered by the insulation layer 144) becomes a channel region 154. Accordingly, the density of oxygen (O) in the source and drain regions 153 and 155 becomes lower than the density of oxygen in the channel region 154. The channel region 154, the source region 153, and the drain region 155 form the semiconductor layer 152.

Compared to an approach of forming a source region and a drain region by introducing hydrogen to an oxide semiconductor, the source region 153 and the drain region 155, according to an exemplary embodiment of the present invention, have higher carrier mobility.

A portion of the metal layer 120 that receives the oxygen from the semiconductor pattern 151, (e.g., a lower portion of the metal layer 120), may be oxidized to become the first portion 130a of a barrier layer 130.

In such a heat treatment process, oxygen moves to the lower portion of the metal layer 120 from the buffer layer 111 such that a lower portion of the metal layer 120, adjacent to the buffer layer 111, may be also oxidized to become the second portion 130b of the barrier layer 130. In this case, the amount of oxygen moved to the lower portion of the metal layer 120 from the buffer layer 111 may be smaller than the amount of oxygen moved to the lower portion of the metal layer 120 from the semiconductor pattern 151. Thus, a thickness TK2 of the first portion 130a of the barrier layer 130 in the third direction D3 may be greater than a thickness TK3 of the second portion 130b in the third direction D3.

Figure 10:
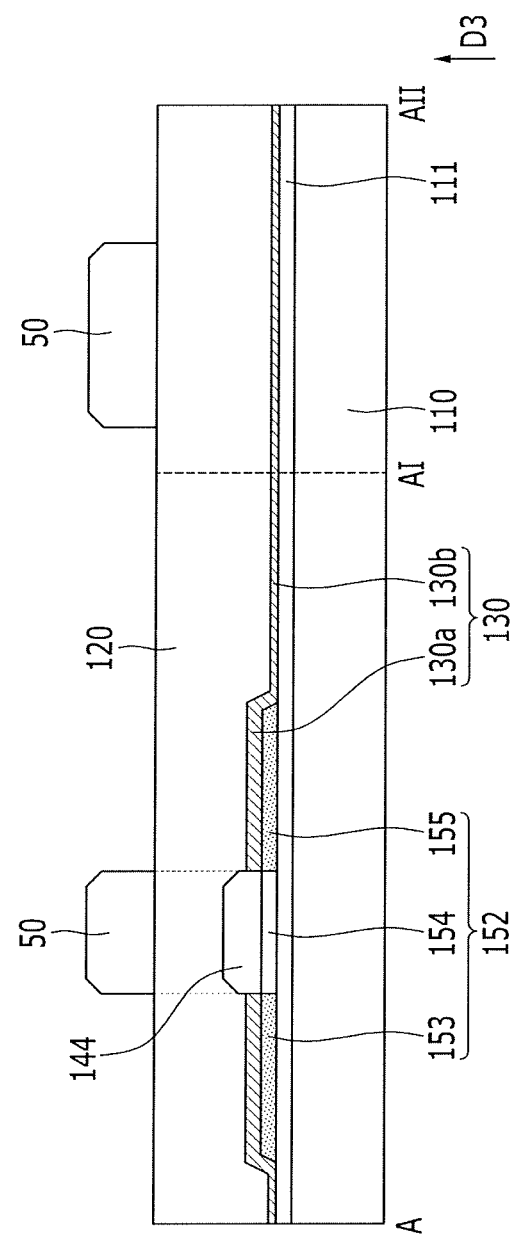

Referring to FIG. 10, a mask pattern 50 may be formed on the metal layer 120. The mask pattern 50, for example, may be formed by coating a photosensitive film such as a photoresist and then performing an exposure process through a photomask. The mask pattern 50 may include a portion overlapping the channel region 154 and a portion not overlapping the semiconductor layer 152 in the third direction D3.

Figure 11:
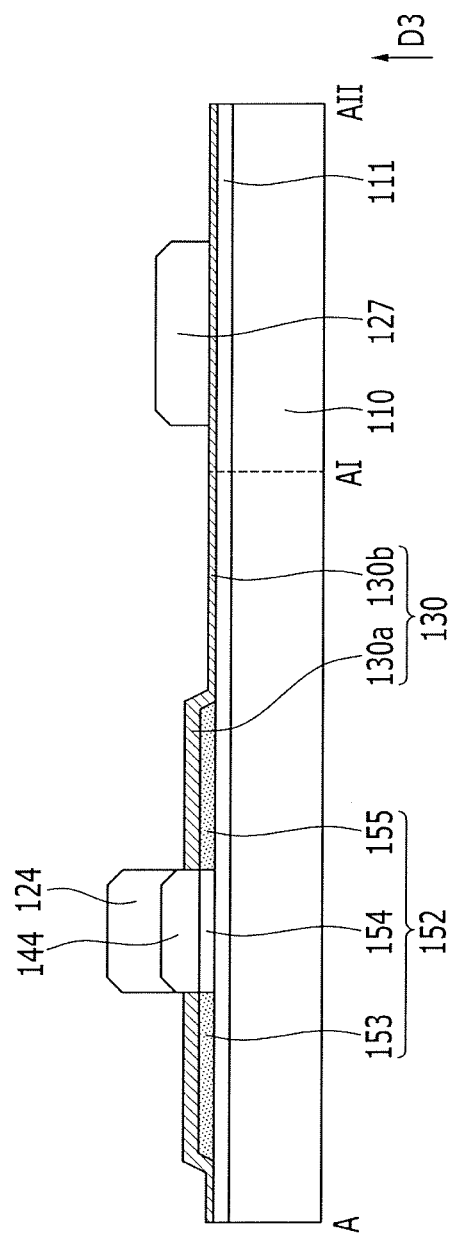

Referring to FIG. 11, the metal layer 120 may be etched with an etching material while using the mask pattern 50 as an etching mask such that an upper electrode 124 and a first conductor 127 are formed. In this case, the first portion 130a in the barrier layer 130 remains unetched. The second portion 130b of the barrier layer 130 may remain or may be removed by the etching process. The thickness of the remaining portion of the barrier layer 130 may be changed depending on a selection ratio of the etching material used in this process with respect to the metal layer 120 and the barrier layer 130. The selection ratio of the etching material used for etching may be high. For example, the selection ratio of the etching material with respect to the metal layer 120 and the barrier layer 130 may be about 10:1 or more, but the invention is not limited to this particular ratio.

As described, a process using only one photomask may be used to form the mask pattern 50, the barrier layer 130, the source region 153, and the drain region 155. In addition, the upper electrode 124 and the first conductor 127 may be simultaneously patterned. Accordingly, the barrier layer 130 can be formed without increasing the number of photomasks.

Further, since the barrier layer 130 can be formed together with the upper layer 124 and the first conductor 127 through a layering process performed for forming the upper electrode 124 and the first conductor 127 without performing an additional process for forming the barrier 130, manufacturing cost and time can be saved.

Further, the source region 153 and the drain region 155 can be formed using an oxidation/reduction reaction of the semiconductor pattern 151 with the metal layer 120. In addition, the barrier layer 130 may be formed at the same time as the source region 153 and the drain region 155. Accordingly, an additional doping process for forming the source region 153 and the drain region 155 may be avoided.

After the metal layer 120 is patterned, the barrier layer 130 may be oxidized again using plasma containing oxygen to increase the oxygen density of the barrier layer 130.

Figure 12:
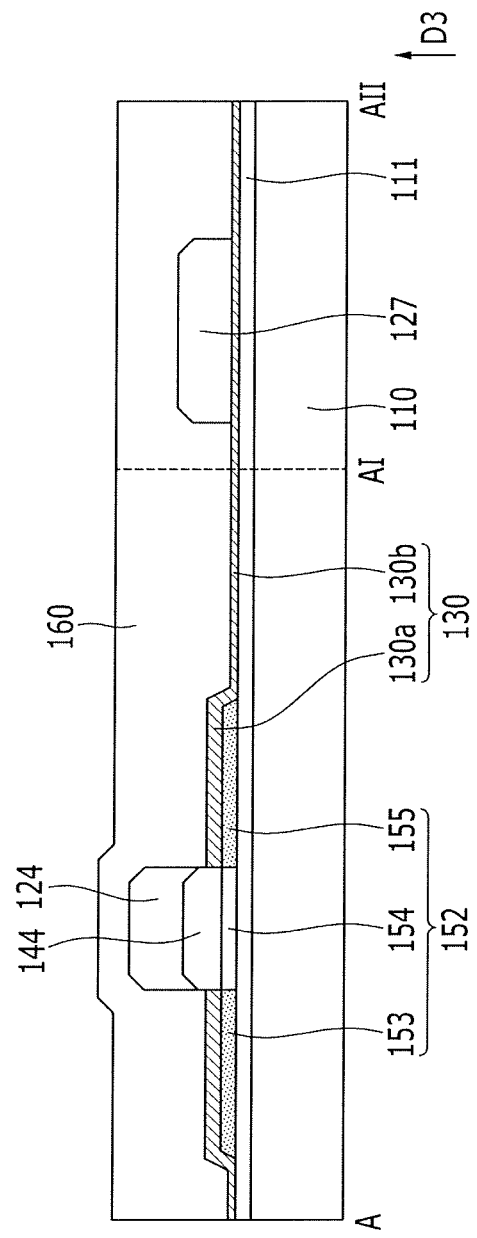

Referring to FIG. 12, an interlayer insulation layer 160 may be formed by layering an insulation material on the substrate 110.

Figure 13:
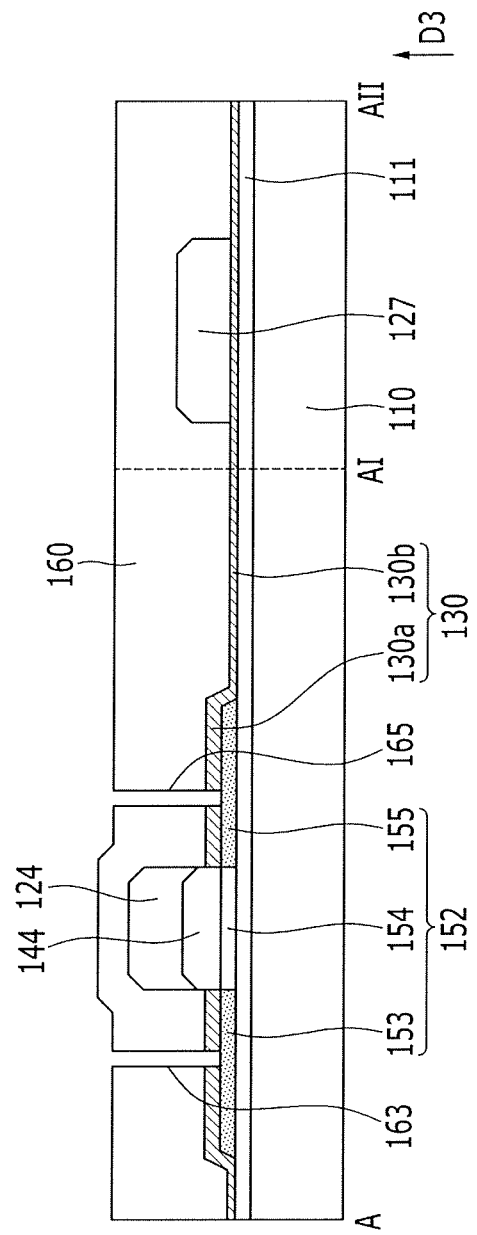

Referring to FIG. 13, the interlayer insulation layer 160 and the barrier layer 130 may be patterned using a method such as dry-etching, or the like, to form a contact hole 163 disposed on the source region 153, and a contact hole 165 disposed on the drain region 155.

Figure 14:
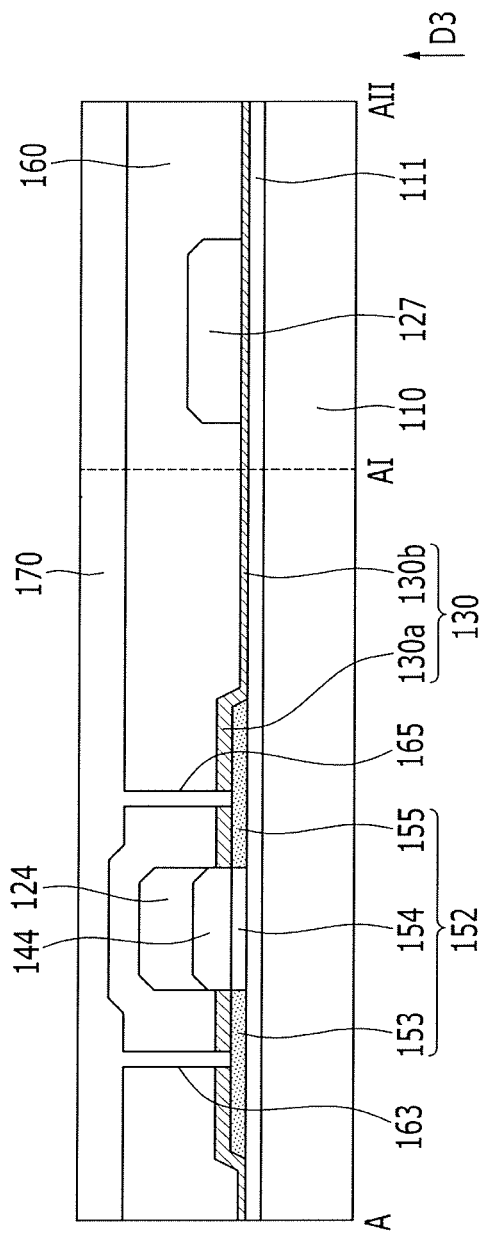

Referring to FIG. 14, a conductive material such as a metal, or the like, may be layered on the interlayer insulation layer 160 so as to form a conductive layer 170.

Figure 15:
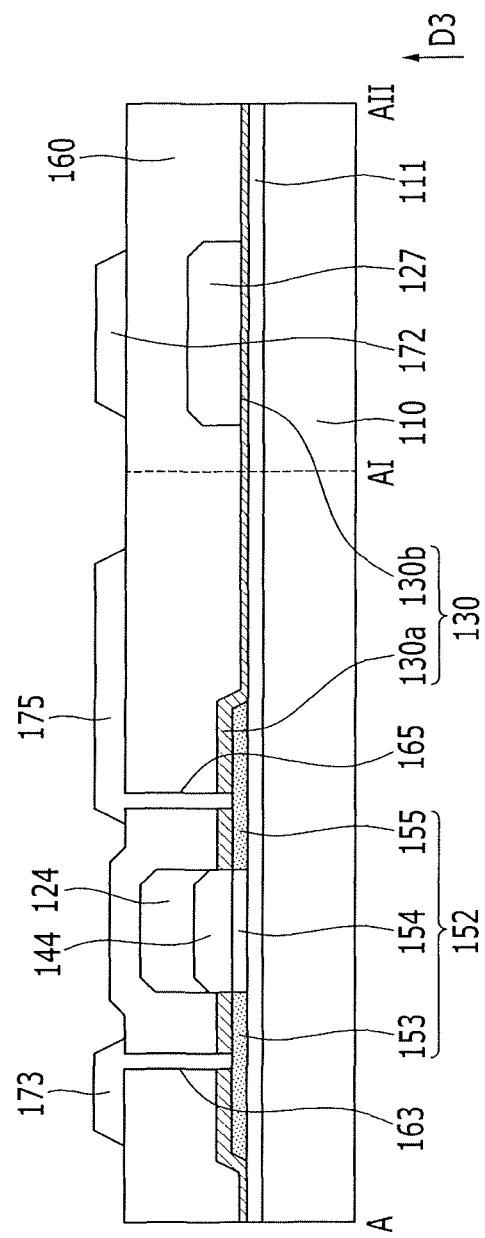

Referring to FIG. 15, the conductive layer 170 may be patterned to form an upper conductive layer including a source electrode 173, a drain electrode 175, and a second conductor 172.

Figure 16:
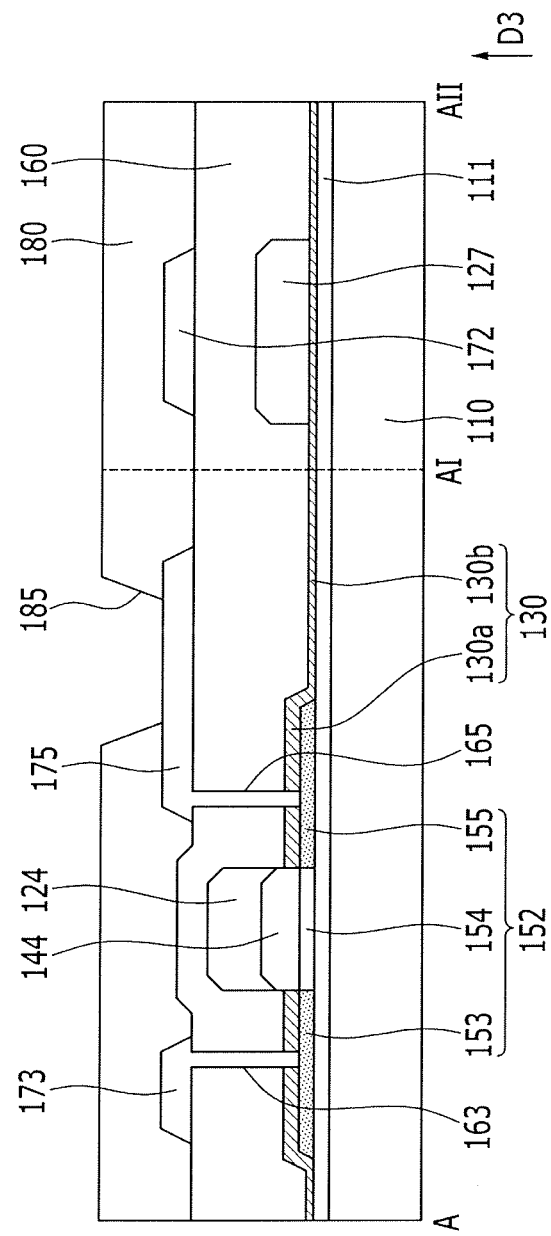

Referring to FIG. 16, a passivation layer 180 including a hole 185 can be formed by layering an inorganic insulation material or an organic insulation material on the upper conductive layer and then patterning the layered material. The hole 185 may be disposed above the drain electrode 175 such that the drain electrode 175 can be exposed.

Referring to FIG. 1, an emission layer 370 may be formed in the hole 185 of the passivation layer 180, and then a common electrode 270 may be formed above the hole 185 and the passivation layer 180. Subsequently, the substrate 110 may be removed and then the substrate 110F may be attached, or the substrate 110 may be used as the substrate 110F.

A transistor panel will be described with reference to FIG. 17 and FIG. 1, according to an exemplary embodiment of the present invention.

Figure 17:
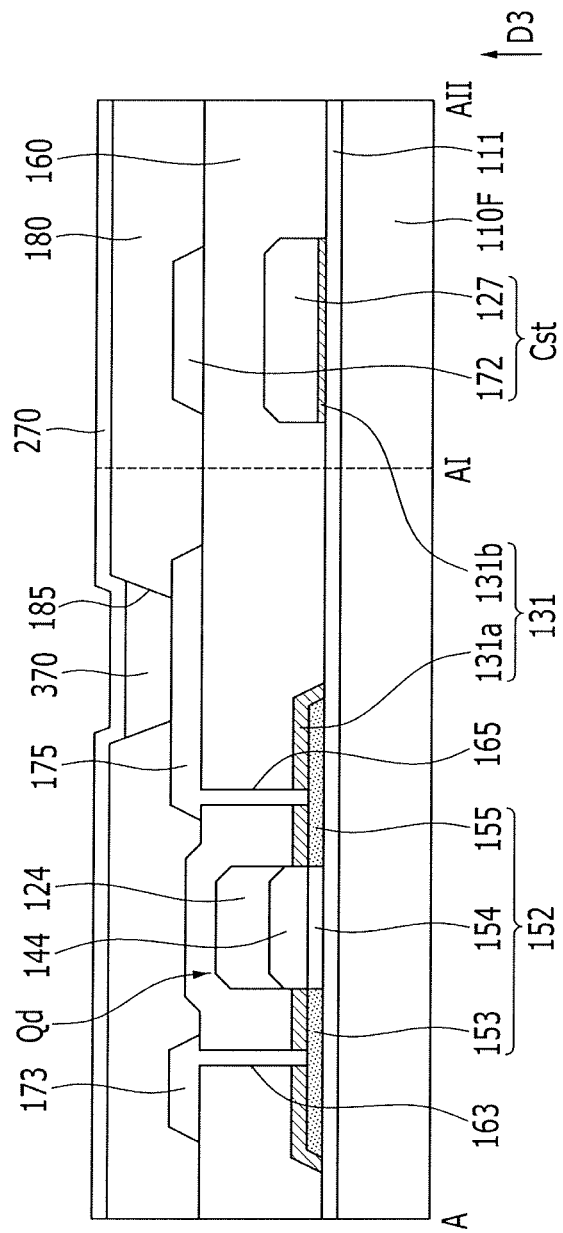
FIG. 17 is a cross-sectional view of a transistor panel according to an exemplary embodiment of the present invention.

FIG. 17 is a cross-sectional view of a transistor panel according to an exemplary embodiment of the present invention.

The transistor panel of FIG. 17 may be similar to the transistor panel of FIG. 1, except for a barrier layer 131.

The barrier layer 131 might not exist (e.g., might not be disposed) between the interlayer insulation layer 160 and the buffer layer 111, except for where the semiconductor layer 152 overlaps the interlayer insulation layer 160, and except for where the first conductor 127 overlaps the buffer layer 111. The barrier layer 131 may include a first portion 131a disposed between a source region 153, a drain region 155, and an interlayer insulation layer 160. The first portion 131a may have the same or similar features as the first portion 130a of the previously described barrier layer 130. Therefore a detailed description thereof will be omitted for brevity.

The barrier layer 131 may further include a second portion 131b disposed between the first conductor 127 and the buffer layer 111. In an exemplary embodiment of the present invention, the second portion 131b may be disposed entirely between the first conductor 127 and the buffer layer 111. The second portion 131b has the same or similar features as the second portion 130b of the previously described barrier layer 130. Therefore a detailed description thereof will be omitted for brevity.

A method for manufacturing a transistor panel will be described with reference to FIG. 18 and FIG. 17, according to an exemplary embodiment of the present invention.

Figure 18:
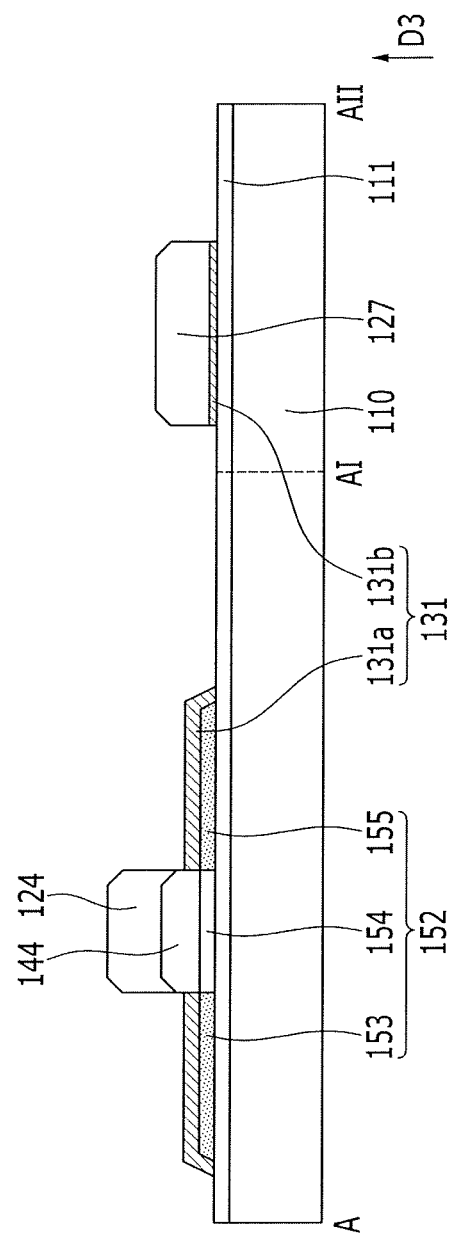
FIG. 18 is a cross-sectional view illustrating a manufacturing method of a transistor panel according to an exemplary embodiment of the present invention.

FIG. 18 is a cross-sectional view illustrating a manufacturing method of a transistor panel according to an exemplary embodiment of the present invention.

A manufacturing method of a transistor panel according to the present exemplary embodiment may be similar to the manufacturing method according to the exemplary embodiments described with reference to FIG. 1 and FIG. 4 to FIG. 16, except that when an upper electrode 124 and a first conductor 127 are formed by etching a metal layer 120, a barrier layer 131 including a first portion 131a and a second portion 131b (which are shown in FIG. 17), can be formed by removing the second portion 130b of the barrier layer 130 not covered by the mask pattern 50 (shown in FIG. 10). In this case, when removing the second portion 130b not covered by (e.g., not overlapping) the mask pattern 50, the thickness of the first portion 131a of the barrier layer 131 may be reduced by as much as the thickness in the third direction D3.

Figure 19:
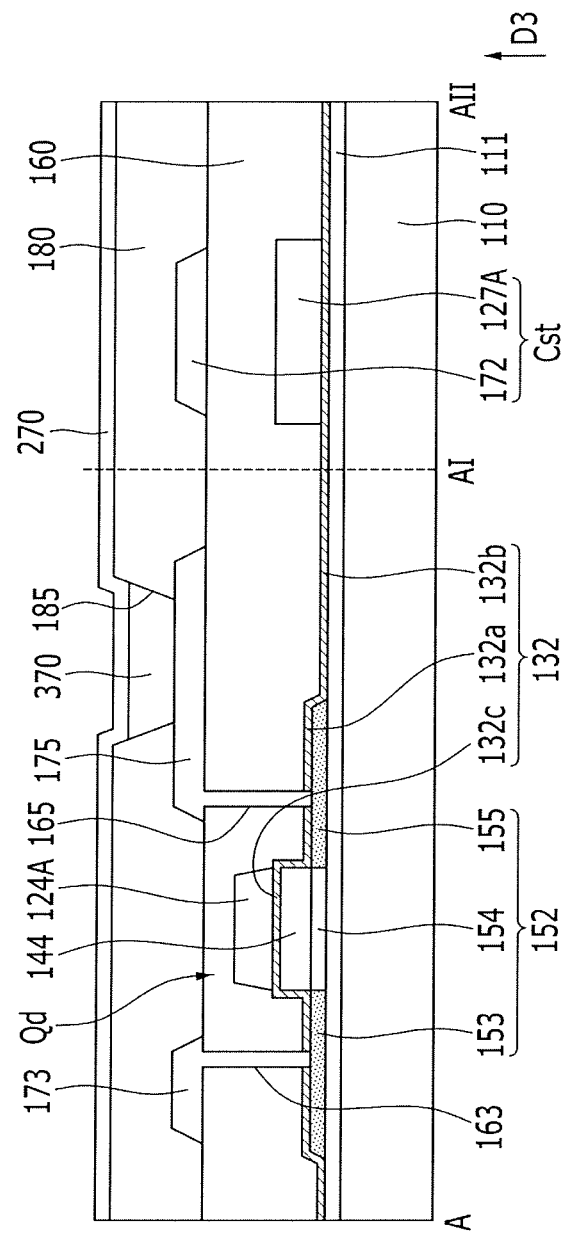
FIG. 19 is a cross-sectional view of a transistor panel according to an exemplary embodiment of the present invention.

FIG. 19 is a cross-sectional view of a transistor panel according to an exemplary embodiment of the present invention.

Referring to FIG. 19, a transistor panel may have a structure that is similar to the structure of the transistor panel shown in FIG. 1, except that a barrier layer 132 of FIG. 19 may be different from the barrier layer 130 of FIG. 1.

The barrier layer 132 may include a first portion 132a disposed between a source region 153, a drain region 155, and an interlayer insulation layer 160, a second portion 132b not overlapping a semiconductor layer 152 and adjacent to a buffer layer 111, and a third portion 132c disposed between an insulation layer 144 and an upper electrode 124A. In an exemplary embodiment of the present invention, the upper electrode 124A may be the same as or similar to the above-described upper electrode 124. Further, a first conductor 127A disposed in the same layer as the upper electrode 124A, and not overlapping the semiconductor layer 152, may have features similar to the above-described first conductor 127.

Since the first portion 132a and the second portion 132b of the barrier layer 132 have the same or similar features as the first portion 130a and the second portion 130b of the above-described barrier layer 130, a detailed description thereof will be omitted for brevity.

The thickness of the barrier layer 132 in the third direction D3 may be substantially constant over the entire length thereof. However, the thickness of the barrier layer 132 is not limited thereto.

The third portion 132c of the barrier layer 132 may be directly adjacent to the insulation layer 144 and may contact the upper surface of the insulation layer 144. The third portion 132c and the first portion 132a of the barrier layer 132 may be connected to each other and may be portions of the same layer. The third portion 132c of the barrier layer 132 may be disposed above the insulation layer 144 and may prevent an impurity such as hydrogen, moisture, or the like, from permeating into the semiconductor 152, that includes a channel region 154, from the insulation layer 144 and a layer disposed above the insulation layer 144. Accordingly, characteristics of the semiconductor layer 152 and a transistor Qd including the semiconductor 152 can be stabilized and the reliability of the transistor Qd can be increased.

The second portion 132b of the barrier layer 132 can be omitted. For example, when the buffer layer 111 including an oxide-based insulation material is omitted, the second portion 132b of the barrier layer 132 can be omitted.

The barrier layer 132 and the upper electrode 124A may include or might not include the same metal.

Other features of materials and functions of the barrier layer 132 may be similar to those of the above-described barrier layer 130.

A method for manufacturing a transistor panel will be described with reference to FIG. 20 to FIG. 24, together with FIG. 19, according to an exemplary embodiment of the present invention.

FIG. 20 to FIG. 24 are cross-sectional views illustrating a manufacturing method of a transistor panel according to an exemplary embodiment of the present invention.

Figure 20:
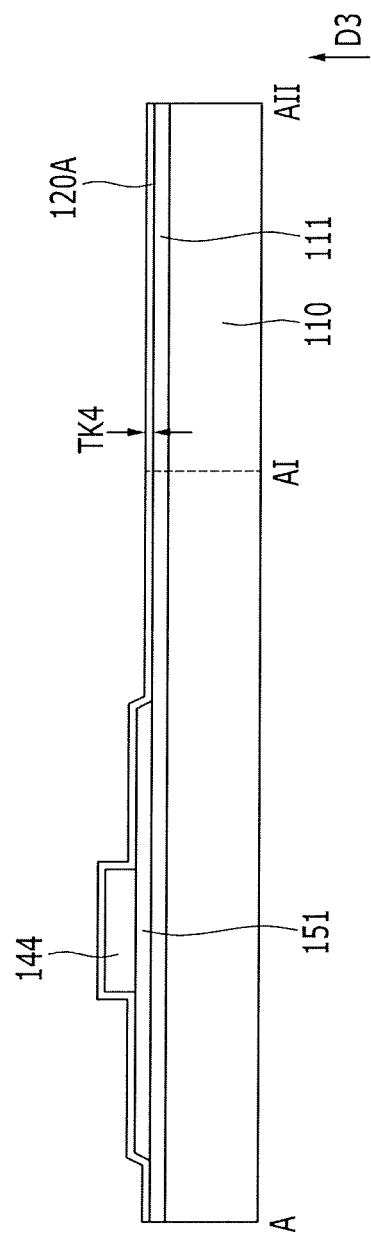
FIG. 20 to FIG. 24 are cross-sectional views illustrating a manufacturing method of a transistor panel according to an exemplary embodiment of the present invention.

Referring to FIG. 20, an insulation layer 144 may be formed through the process described with reference to FIG. 4 to FIG. 7, and then a high-reactive metal such as aluminum (Al), titanium (Ti), molybdenum (Mo), or the like, may be layered on a substrate 110 such that a metal layer 120A may be formed. A thickness TK4 of the metal layer 120A in a third direction D3 may be about 50 angstroms or less, but the invention is not limited to this particular thickness.

Figure 21:
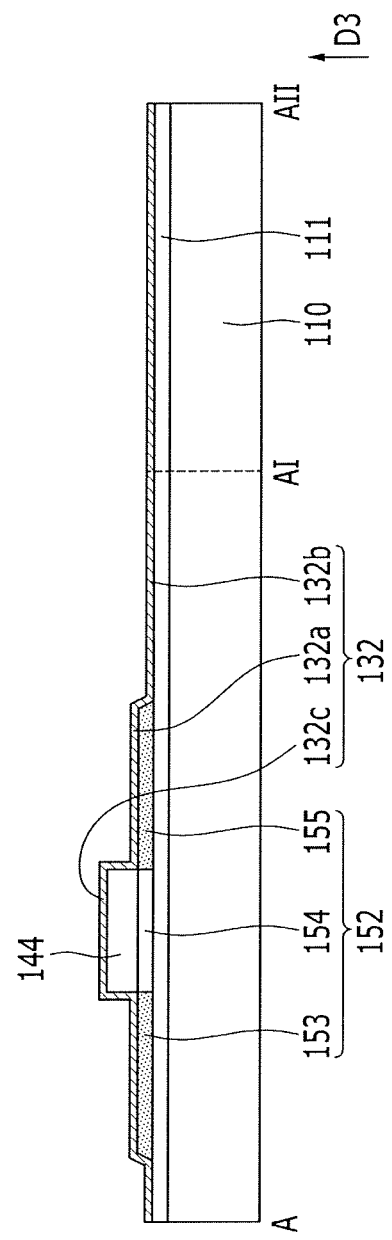

Referring to FIG. 21, the substrate 110, where the metal layer 120A is formed, may be thermally treated to oxidize the metal layer 120A. In this case, oxygen moves to the metal layer 120A from a semiconductor pattern 151 and a buffer layer 111 that are adjacent to the metal layer 120A. Thus, the metal layer 120A may be oxidized such that a barrier layer 132 including a first portion 132a and a second portion 132b may be formed. In this process, a part of the semiconductor pattern 151 may be reduced and to become a source region 153 and a drain region 155, which are conductive regions. The semiconductor pattern 151 covered by the insulation layer 144 becomes a channel region 154. The channel region 154, the source region 153, and the drain region 155 form a semiconductor layer 152.

When the insulation layer 144 includes an oxide-based insulation material, oxygen moves to the metal layer 120A from the insulation layer 144 such that a third portion 132c of the barrier layer 132 can be formed. Alternatively, a thermal treatment process may be additionally performed under an oxygen atmosphere to form the third portion 132c of the barrier layer 132, disposed above the insulation layer 144. The metal later 120A may be wholly oxidized through an additional thermal treatment.

In the barrier layer 132, the thickness of the first portion 132a in a third direction D3 may be greater than or similar to the thickness of the second portion 132b and the thickness of the third portion 132c in the third direction D3. For example, when the amount of oxygen flowing to the metal layer 120A from the semiconductor pattern 151 is greater than the amount of oxygen flowing to the metal layer 120A from the insulation layer 144 or the buffer layer 111, the thickness of the first portion 132a in the third direction D3 may be greater than the thicknesses of the second and third portions 132b and 132c in the third direction D3. However, as previously described, when the additional thermal treatment is performed, the thickness of the first portion 132a in the third direction D3 may be similar to the thickness of the second portion 132b and the thickness of the third portion 132c in the third direction D3.

Figure 22:
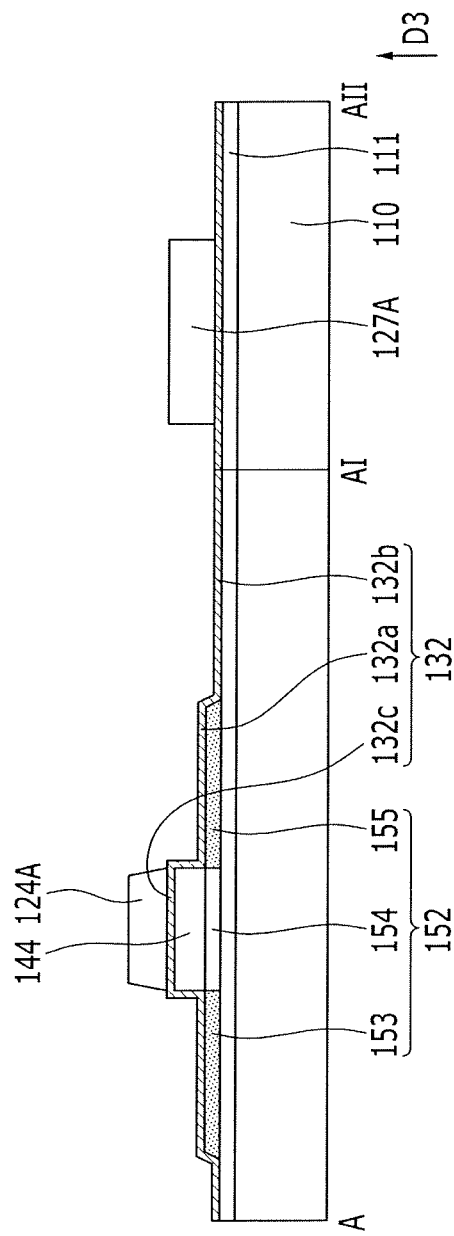

Referring to FIG. 22, a conductive material such as a metal may be layered on the barrier layer 132, and then patterned such that an upper electrode 124A and a first conductor 127A are formed. In this case, the barrier layer 132 may remain rather than being etched. A metal that both the upper electrode 124A and the first conductor 127A include may be the same as or different from a metal included in the barrier layer 132.

Figure 23:
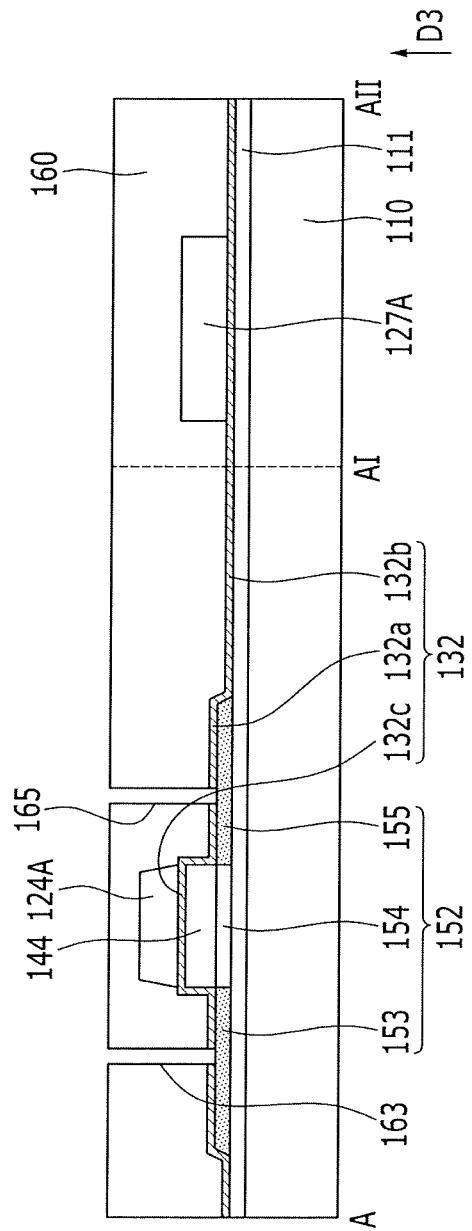

Referring to FIG. 23, an interlayer insulation layer 160 that includes contact holes 163 and 165 may be formed by layering an insulation layer on a substrate 110 and then the insulation material may be patterned.

Figure 24:
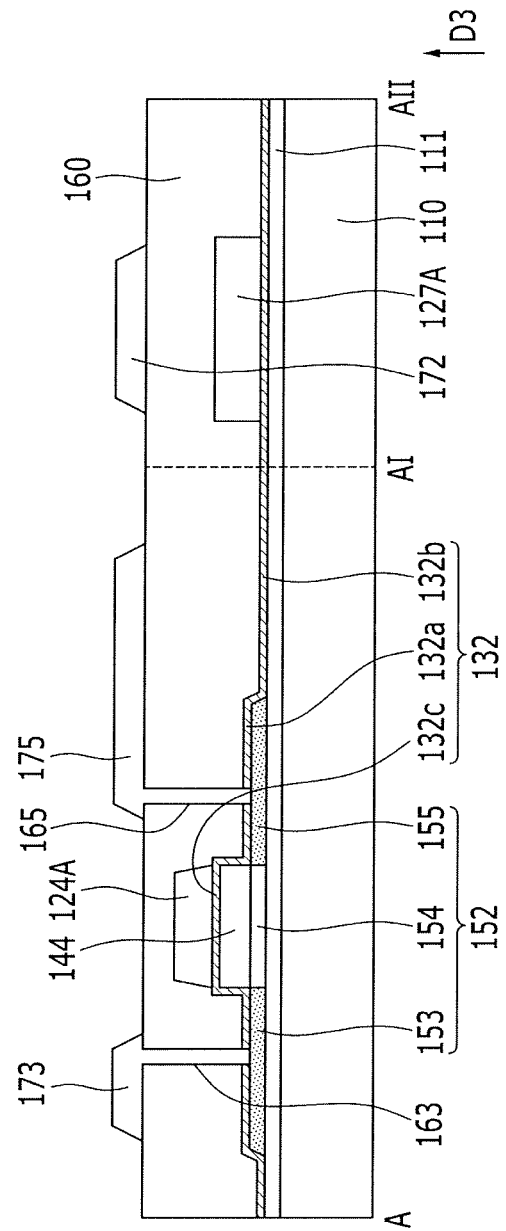

Referring to FIG. 24, a conductive material such as a metal may be layered on the interlayer insulation layer 160 and then patterned such that an upper conductive layer including a source electrode 173, a drain electrode 175, and a second conductor 172 may be formed. The subsequent processes may be the same as those described above, and a duplicate description thereof will be omitted for brevity.

A transistor panel, according to an exemplary embodiment of the present invention, will be described with reference to FIG. 25 and FIG. 26, together with FIG. 1 and FIG. 2.

Figure 25:
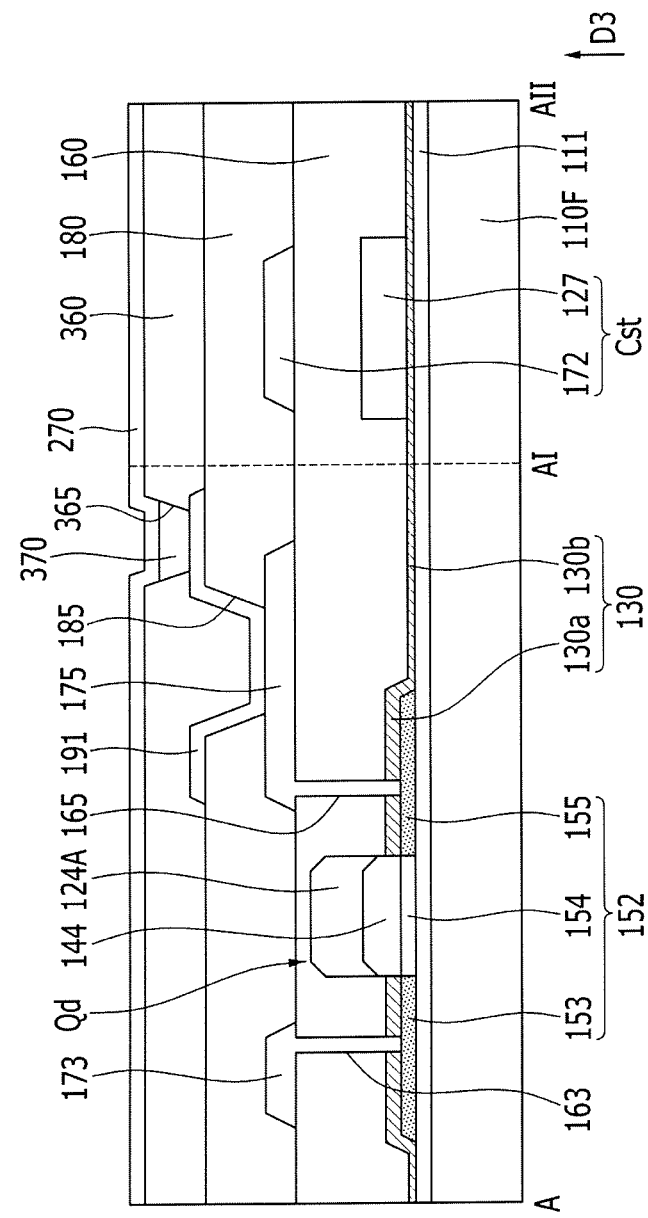
FIG. 25 is a cross-sectional view of a transistor panel according to an exemplary embodiment of the present invention.

FIG. 25 is a cross-sectional view of a transistor panel according to an exemplary embodiment of the present invention. FIG. 26 is a layout view of a transistor panel according to an exemplary embodiment of the present invention. FIG. 25 is, for example, a cross-sectional view of the transistor panel of FIG. 26 taken along lines A-AI and AI-II.

Figure 26:
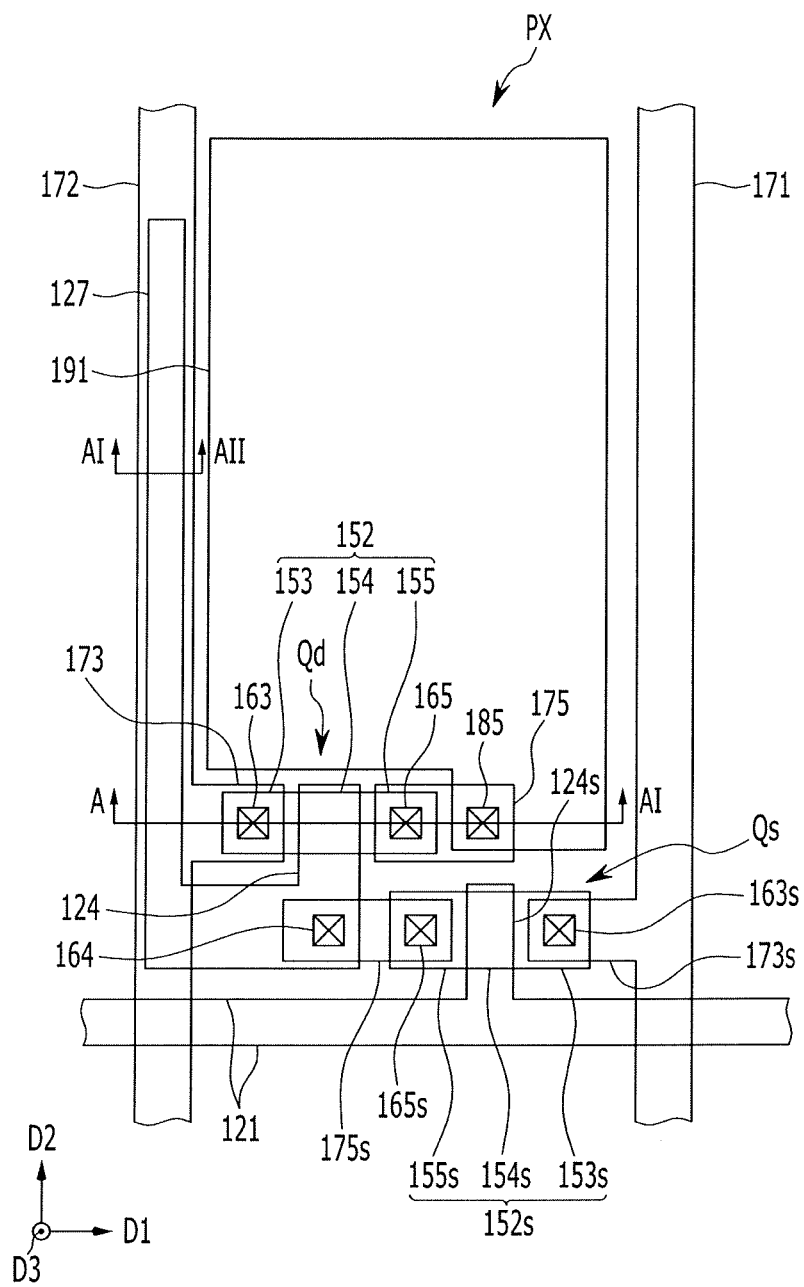
FIG. 26 is a layout view of the transistor panel according to an exemplary embodiment of the present invention.

Referring to FIG. 25 and FIG. 26, a transistor panel may be similar to the transistor panel shown in FIG. 1 and FIG. 2 in structure, except for constituent elements disposed above a passivation layer 180.

According to an exemplary embodiment of the present invention, a pixel electrode 191, connected with a drain electrode 175 through a hole 185, may be disposed on the passivation layer 180. A pixel defining layer 360 may be disposed above the pixel electrode 191 and the passivation layer 180. The pixel defining layer 360 may include holes 365 disposed above the pixel electrode 191. An emission layer 370, that may be disposed above the pixel electrode 191, may be disposed in the hole 365, and a common electrode 270 may be disposed on the emission layer 370. The pixel electrode 191, the emission layer 370, and the common electrode 270 may form an OLED.

A transistor panel, according to an exemplary embodiment of the present invention, will be described with reference to FIG. 27, together with FIG. 25.

Figure 27:
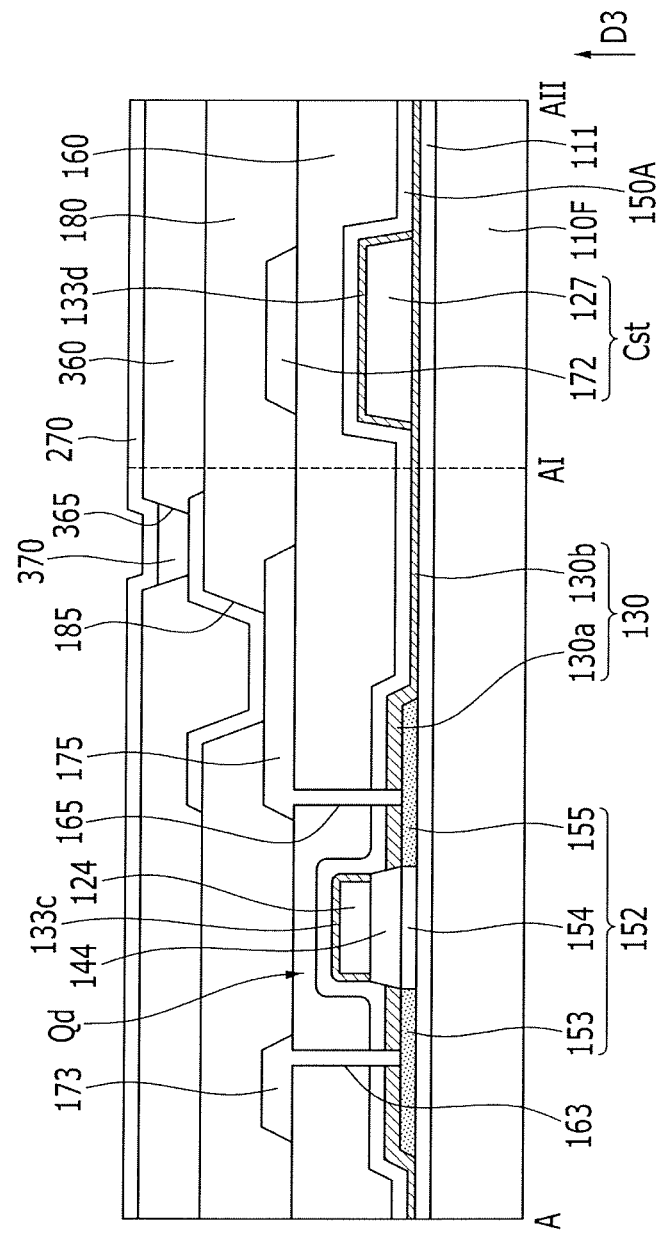
FIG. 27 is a cross-sectional view of a transistor panel according to an exemplary embodiment of the present invention.

FIG. 27 is a cross-sectional view of a transistor panel according to an exemplary embodiment of the present invention.

Referring to FIG. 27, a transistor panel may be similar to the transistor panel of FIG. 25 and the transistor panel of FIG. 19 in structure, but may further include an upper semiconductor layer 150A and additional barrier layers 133c and 133d.

The additional barrier layer 133c may be disposed between an upper electrode 124 and an interlayer insulation layer 160, and may contact the upper surface and the side surface of the upper electrode 124, and be adjacent to the upper electrode 124.

The additional barrier layer 133d may be disposed between a first conductor 127 and the interlayer insulation layer 160, and may contact the upper surface and the side surface of the first conductor 127, and be adjacent to the first conductor 127. The additional barrier layer 133d may be connected with a second portion 130b of a barrier layer 130. In an exemplary embodiment of the present invention, the additional barrier layer 133d can be omitted.

The thickness of the additional barrier layer 133c and the thickness of the additional barrier 133d in the third direction D3 may be approximately equal to each other.

The additional barrier layer 133c may be disposed on the upper electrode 124, and can prevent an impurity such as hydrogen, moisture, or the like, from permeating into a semiconductor layer 152 that includes a channel region 154 from a layer disposed above the upper electrode 124.

In addition, the additional barrier layers 133c and 133d are disposed in interfaces between the upper electrode 124, the first conductor 127, and the interlayer insulation layer 160 to block reactions between the upper electrode 124, the first conductor 127, and the interlayer insulation layer 160. Thus, without regard to the type of metal included in the upper electrode 124 and the first conductor 127, a material of the interlayer insulation layer 160 can be selected as needed. For example, the interlayer insulation layer 160 may include a nitride-based insulation material which has low reactivity with the upper electrode 124 and the first conductor 127, such as a silicon nitride (SiNx), or may include an oxide-based insulation material which has high reactivity, such as a silicon oxide (SiOx). When the interlayer insulation layer 160 includes an oxide-based insulation material, the amount of hydrogen that can permeate into the semiconductor layer 152 from the interlayer insulation layer 160 can be reduced to prevent a characteristic of the channel region 154 from being changed.

The additional barrier layers 133c and 133d may include a metal oxide, and they may be electrically insulating. In addition, the additional barrier layers 133c and 133d, the upper electrode 124, and the first conductor 127 may include the same metal.

The upper semiconductor layer 150A may include a portion disposed between the additional barrier layer 133c and 133d and the interlayer insulation layer 160 and a portion disposed between the barrier layer 130 and the interlayer insulation layer 160. Alternately, the upper semiconductor layer 150A may include a portion disposed only between the additional barrier layers 133c and 133d and the interlayer insulation layer 160.

The upper semiconductor layer 150A may include a metal oxide such as indium-containing oxide such as indium oxide (InO), indium-zinc oxide (IZO), indium-gallium oxide (IGO), indium-gallium-zinc oxide (IGZO), indium-gallium-tin oxide (IGTO), indium-zinc-tin oxide (IZTO), or the like, zinc oxide (ZnO), zinc-tin oxide (ZTO), or the like.

The thickness of the upper semiconductor layer 150A in a third direction D3 may be about 30 angstroms or less, but exemplary embodiments of the present invention are not limited thereto.

A method for manufacturing a transistor panel, according to an exemplary embodiment of the present invention, will be described with reference to FIG. 28 and FIG. 29, together with FIG. 27.

Figure 28:
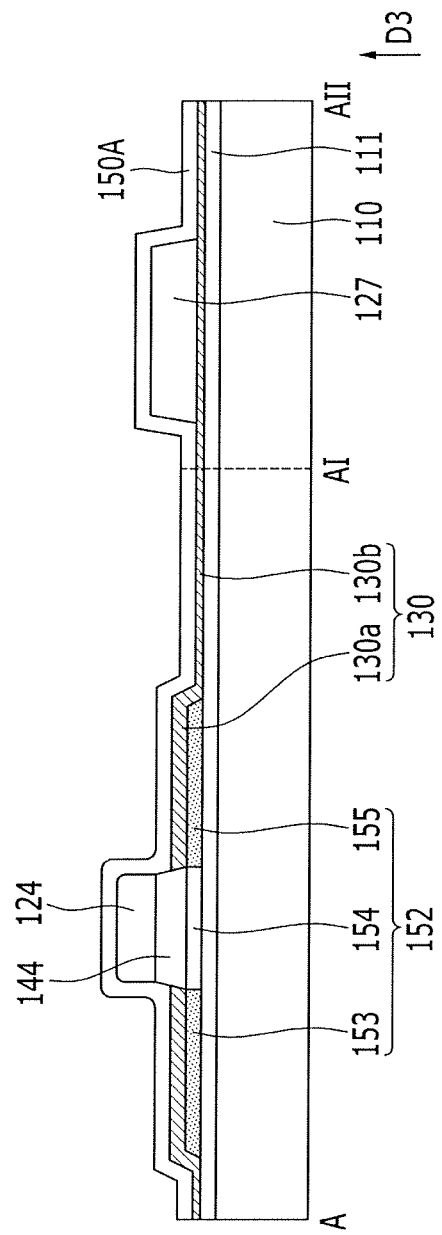
FIG. 28 and FIG. 29 are cross-sectional views illustrating a structure of each step of a method for manufacturing a transistor panel according to an exemplary embodiment of the present invention.
Figure 29:
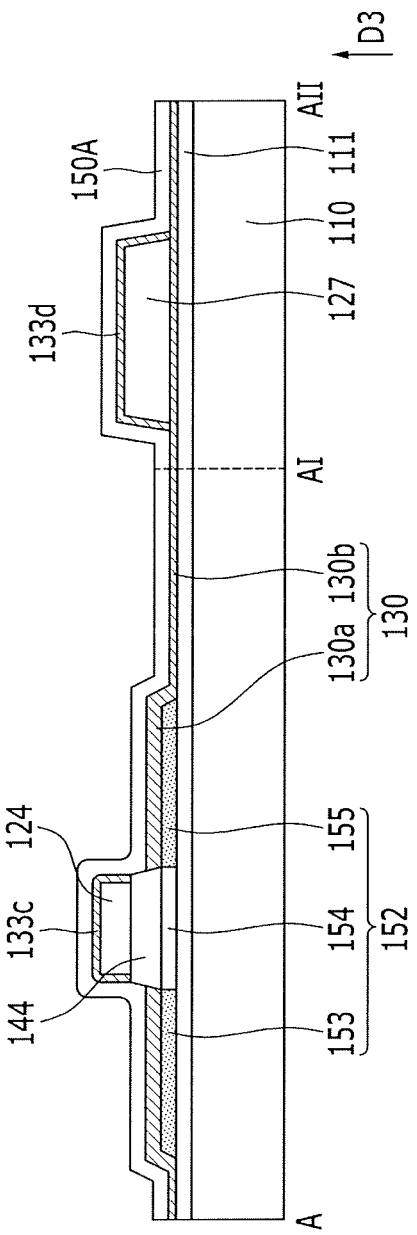

FIG. 28 and FIG. 29 are cross-sectional views illustrating a manufacturing method of a transistor panel according to an exemplary embodiment of the present invention.

Referring to FIG. 28, an upper electrode 124 and a first conductor 127 may be formed through the processes described with reference to FIG. 4 to FIG. 11. Then, a metal oxide material such as an indium-containing oxide such as indium oxide (InO), indium-zinc oxide (IZO), indium-gallium oxide (IGO), indium-gallium-zinc oxide (IGZO), indium-gallium-tin oxide (IGTO), indium-zinc-tin oxide (IZTO), or the like, zinc oxide (ZnO), zinc-tin oxide (ZTO), or the like, may be layered on a substrate 110 such that an upper semiconductor layer 150A may be formed. As previously described, the thickness of the upper semiconductor layer 150A in the third direction D3 may be about 50 angstroms or less, but exemplary embodiment of the present invention are not limited thereto.

Referring to FIG. 29, a substrate 110, where the upper semiconductor layer 150A is formed, may be thermally treated. Then, oxygen moves to an upper electrode 124 and a first conductor 127 from the upper semiconductor layer 150, which may be adjacent to the upper electrode 124 and the first conductor 127, such that the upper semiconductor layer 150A may be reduced. In addition, an upper end and a side end of each of the upper electrode 124 and the first conductor 127, which are portions adjacent to the upper semiconductor layer 150A, are oxidized such that additional barrier layers 133c and 133d are formed.

According to an exemplary embodiment of the present invention, the upper semiconductor layer 150A can be removed.

The subsequent processes may be the similar to those described above, and a duplicative description thereof will be omitted for brevity.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A transistor panel, comprising:
   a channel region including a first oxide of a first metal;
   a source region and a drain region, each including the first metal, wherein the channel region is disposed between the source region and the drain region, and wherein the channel region is connected to the source region and the drain region;
   an insulation layer disposed on the channel region;
   an upper electrode disposed on the insulation layer;
   an interlayer insulation layer disposed on the upper electrode, the source region and the drain region; and
   a barrier layer including a first portion disposed between the interlayer insulation layer and each of the source region and the drain region, wherein the first portion of the barrier layer contacts each of the source region and the drain region,
   wherein the upper electrode and the barrier layer each comprise a second metal, and
   the barrier layer does not overlap the upper electrode in a direction perpendicular to a top surface of the upper electrode.

2. The transistor panel of claim 1, wherein the barrier layer comprises a second oxide of the second metal.

3. The transistor panel of claim 2, wherein a density level of oxygen included in the channel region is higher than a density level of oxygen included in each of the source region and the drain region.

4. The transistor panel of claim 3, further comprising a buffer layer disposed on the channel region,
   wherein the barrier layer further comprises a second portion that is disposed between the buffer layer and the interlayer insulation layer, and wherein the second portion of the barrier layer contacts the buffer layer.

5. The transistor panel of claim 4, wherein a thickness of the first portion of the barrier layer is greater than a thickness of the second portion of the barrier layer.

6. The transistor panel of claim 5, further comprising a first conductor disposed on the second portion of the barrier layer,
   wherein the second portion of the barrier layer is disposed only between the first conductor and the buffer layer.

7. The transistor panel of claim 1, wherein each of the interlayer insulation layer and the first portion of the barrier layer comprises a first contact hole disposed on the source region, and a second contact hole disposed on the drain region.

\* \* \* \* \*